(12) United States Patent
Park et al.

(10) Patent No.: US 6,480,409 B2
(45) Date of Patent: Nov. 12, 2002

(54) MEMORY MODULES HAVING INTEGRAL TERMINATING RESISTORS AND COMPUTER SYSTEM BOARDS FOR USE WITH SAME

(75) Inventors: Myun-joo Park, Incheon (KR); Byung-se So, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/858,401

(22) Filed: May 16, 2001

(65) Prior Publication Data

US 2001/0050858 A1 Dec. 13, 2001

(30) Foreign Application Priority Data

May 19, 2000 (KR) ........................................ 2000-27026

(51) Int. Cl.$^7$ ................................................. G11C 5/06
(52) U.S. Cl. .......................................... 365/63; 365/51
(58) Field of Search ...................... 365/61, 53, 230.03

(56) References Cited

U.S. PATENT DOCUMENTS

| | | | | |
|---|---|---|---|---|
| 5,175,704 A | * | 12/1992 | Minagawa et al. | 365/185.05 |
| 6,175,517 B1 | * | 1/2001 | Jigour et al. | 365/51 |
| 6,208,548 B1 | * | 3/2001 | Kawagoe | 365/194 |

FOREIGN PATENT DOCUMENTS

| | | |
|---|---|---|
| JP | 10301682 | 11/1998 |
| JP | P1998-703580 | 11/1998 |
| JP | P1999-0076547 | 10/1999 |

OTHER PUBLICATIONS

Notice to Submit Response, Korean Application No. 10–2000–0027026, Jan. 28, 2002.

* cited by examiner

*Primary Examiner*—Son T. Dinh
(74) *Attorney, Agent, or Firm*—Myers Bigel Sibley & Sajovec

(57) ABSTRACT

A memory module for use with a computer system board includes at least one memory chip connected to a bus line conductor and a terminating resistor connected to the bus line conductor. The memory module further includes a connector configured to connect the bus line conductor to bus line of the computer system board. A computer system board includes a bus line including first branch configured to connect to a first memory module and a second branch configured to connect to a second memory module. The computer system board further includes a memory controller coupled to the first and second branches of the bus line at a single pin thereof. In other embodiments, a computer system board includes a bus line having first and second branches. A first switch is operative to selectively couple a first plurality of memory modules to a first branch of a bus line of the system board. A second switch is operative to selectively couple a second plurality of memory modules to the second branch of the bus line. The system board further includes a memory controller connected to the first and second branches of the bus line at a single pin thereof.

8 Claims, 4 Drawing Sheets

US 6,480,409 B2

MEMORY MODULES HAVING INTEGRAL TERMINATING RESISTORS AND COMPUTER SYSTEM BOARDS FOR USE WITH SAME

RELATED APPLICATION

This application claims the benefit of Korean Application No. 2000-27026, filed May 19, 2000, the disclosure of which is hereby incorporated herein by reference.

FIELD OF THE INVENTION

The present invention relates to memory devices, and more particularly, to memory modules and computer system boards for use therewith.

BACKGROUND OF THE INVENTION

As the performance of microprocessors (CPUs) has increased, current memory systems have generally been required to process increasingly large amounts of data at increasingly higher speed. This increased demand generally arises from elongation of word length, increases in clock frequency, and enlargement of data bus width. In particular, an increase in the width of an external data bus may require a corresponding increase in the storage capacity and data transmission speed of a memory system interconnected with the CPU. The transmission speed of the memory system, which indicates the amount of input and output data being transmitted per unit time, may be referred to as its bandwidth. A memory system having a wide bandwidth often uses a wide data bus that operates at a high frequency.

As the width of the data bus of a memory system increases, the size of memory modules used in such a system typically increases. The increase in the size of a memory module may arise from an increase in the number of memory chips used in the module and/or from an increase in the number of memory module pins.

FIG. 1 illustrates a conventional memory module having a loop-through structure. Referring to FIG. 1, a memory module 15 is mounted on a system board 10, and a plurality of memory chips 11, 12, 13, and 14 are mounted on the memory module 15. The memory chips 11, 12, 13, and 14 share a bus line (several such bus lines are typically present) and receive or send data which is input or output through module pins 16 and 17 and the bus line. The system board 10 has a terminating voltage terminal Vterm and a terminating resistor Rterm located between the terminating voltage terminal Vterm and the memory module pins 16 and 17. The terminating resistor Rterm is used in terminating the bus line.

In the conventional memory module 15, the bus lines of the memory chips 11, 12, 13, and 14 are connected to the terminating resistor Rterm through the memory module pins because the terminating resistor Rterm is built into the system board 10. Therefore, as the number of bus lines of the memory chips 11, 12, 13, and 14 increases, the number of memory module pins connected to the bus lines also increases. This generally increases the size of the memory module. The memory module pins are connected to a connector socket 18, which may introduce noise to data signals passing through the socket 18. As the number of contact points of the socket 18 through which bus lines pass increases, the performance of the bus lines may be degraded.

FIG. 2 is a diagram briefly illustrating a conventional system board 20. The system board 20 includes a plurality of memory modules 22, 23 that are connected to a memory controller 21 through a bus line IO BUS. A terminating resistor Rterm is installed between the bus line IO BUS and a terminating voltage terminal Vterm. The memory modules 22 and 23 are daisy chain connected to the bus line IO BUS of the memory controller 21. In this system board 20, a first memory module 22 adjacent to the memory controller 21 may have a smaller data propagation time than that of a second memory module 23 relatively far away from the memory controller 21. The operating speed of such a memory system is generally determined by the longest data propagation time.

SUMMARY OF THE INVENTION

In embodiments of the present invention, a memory module for use with a computer system board includes at least one memory chip connected to a bus line conductor and a terminating resistor connected to the bus line conductor. The memory module further includes a connector configured to connect the bus line conductor to bus line of the computer system board.

In other embodiments of the invention, a computer system board includes a bus line including a first branch configured to connect to a first memory module and a second branch configured to connect to a second memory module. The computer system board further includes a memory controller coupled to the first and second branches of the bus line at a single pin thereof. Each of the first and second memory modules may include a plurality of memory chips connected in common to a bus line conductor, a terminating resistor connected to the bus line conductor, and a connector that couples the bus line conductor of the memory module to a respective one of the first and second branches of the bus line of the computer system board.

In still other embodiments of the present invention, a computer system board includes a bus line including first and second branches. The computer system board includes a first switch that is operative to selectively couple a first plurality of memory modules to the first branch of a bus line of the system board. The computer system board further includes a second switch that is operative to selectively couple a second plurality of memory modules to the second branch of the bus line. The system board further includes a memory controller connected to the first and second branches of the bus line at a single pin thereof.

DETAILED DESCRIPTION

Figure 1:
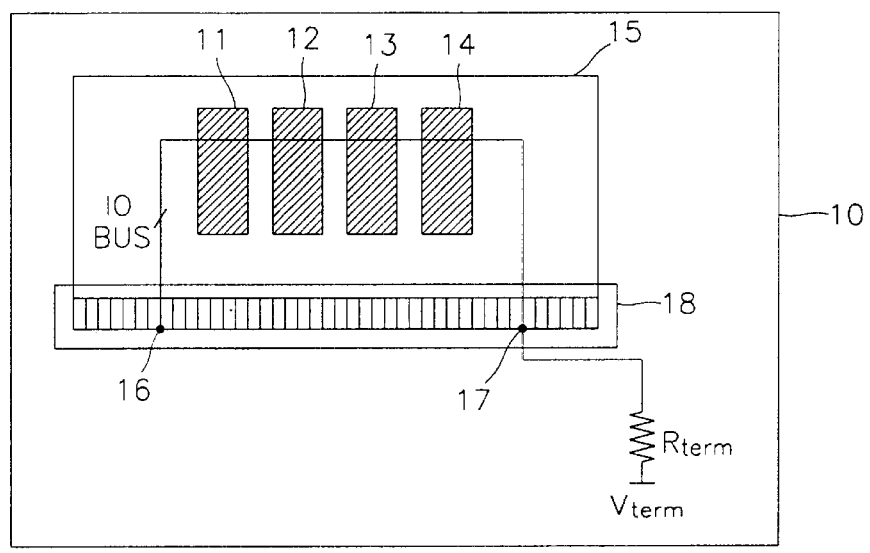
FIG. 1 is a schematic diagram illustrating a conventional memory module.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

The present invention provides a memory module and a computer system board for use with the same. Memory modules may include logic chips in addition to one or more memory chips; however, for illustrative purposes, the following description relates to a memory module including memory chips, and discussion of logic and other circuitry will not be provided. In general, depending on the performance of a memory module, the number of bus lines in the memory module can vary. Address signals, data signals, and control signals may be transmitted on the bus lines.

Figure 3:
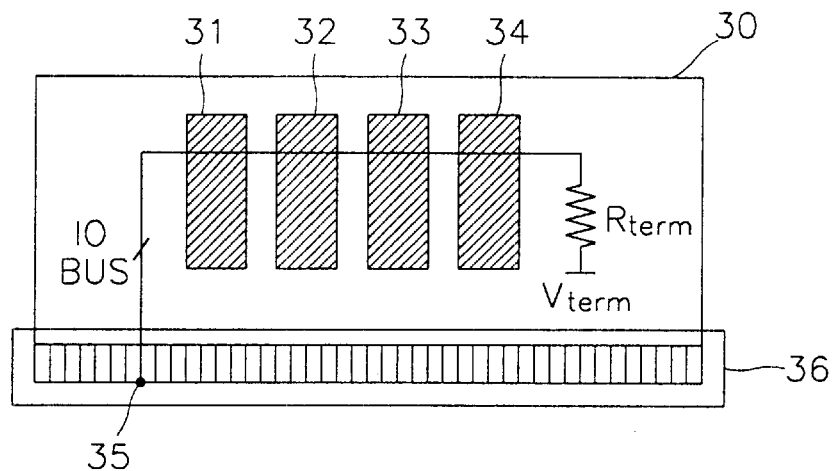
FIG. 3 is a schematic diagram illustrating a memory module according to embodiments of the present invention.

FIG. 3 is a diagram illustrating a memory module 30 according to an embodiment of the present invention. The memory module 30 includes a plurality of memory chips 31, 32, 33, 34 on a substrate 37. The memory chips 31, 32, 33, 34 are connected in common to a bus line IO BUS. The bus line IO BUS is controlled by a memory controller (not shown) on a computer system board (not shown) connected to the memory module 30. One end of the bus line IO BUS is connected to the memory controller via a connector conductor 35. Another end of the bus line IO BUS is connected to a terminating resistor Rterm, which is also disposed on the substrate 37 of the memory module 30. It will be appreciated that several such bus lines may be present, with respective terminations provided for respective ones of the bus lines. As shown in FIG. 3, the terminating resistor Rterm is included in the memory module 30 of FIG. 3. Although the terminating resistor Rterm occupies area on the substrate 37, the terminating resistor Rterm can be positioned in an area of the substrate 37 not used for memory devices.

Referring back to the conventional computer system of FIG. 1, the bus line IO BUS of FIG. 1 is connected to a memory controller and to a terminating resistor Rterm using two conductors 16, 17 of a connector 18. In contrast the bus line IO BUS of FIG. 3 is connected to a memory controller via one conductor 35 of a connector 36. Because the arrangement of FIG. 3 uses fewer conductors in the connector 36 for each bus line IO BUS, the amount of noise introduced by the bus line IO BUS can be reduced.

Figure 4:
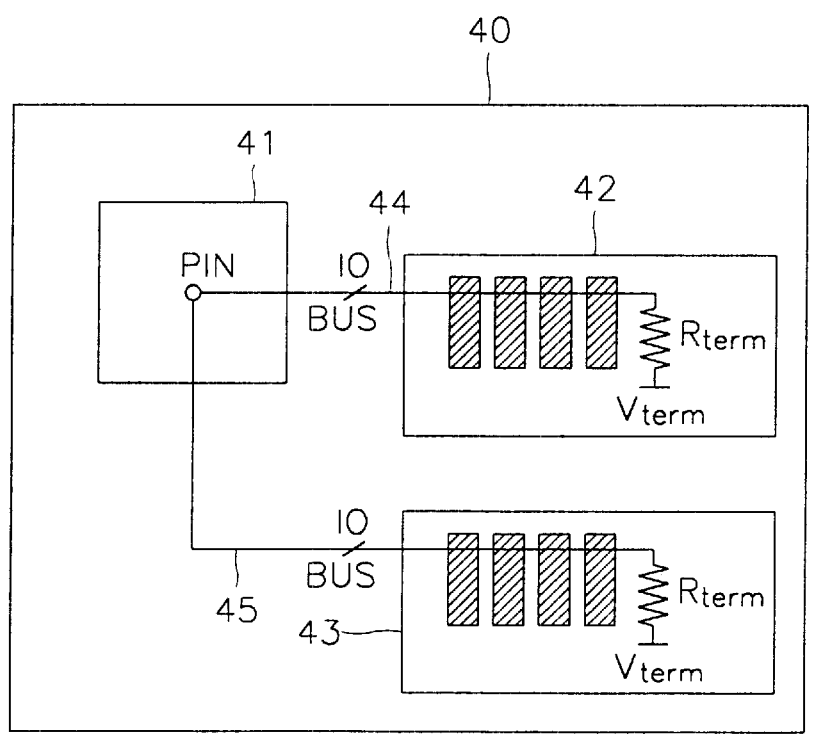
FIG. 4 is a schematic diagram illustrating a computer system board according to embodiments of the present invention.

FIG. 4 is a diagram illustrating a computer system board 40 according to embodiments of the present invention. The computer system board 40 includes a memory controller 41 and memory modules 42, 43. The memory modules 42, 43 are connected to a pin PIN of the memory controller 41 via respective branches 44, 45 of a bus line IO BUS. Each of the memory modules 42, 43 includes a plurality of memory chips connected to the bus line IO BUS, and a terminating resistor Rterm.

Figure 2:
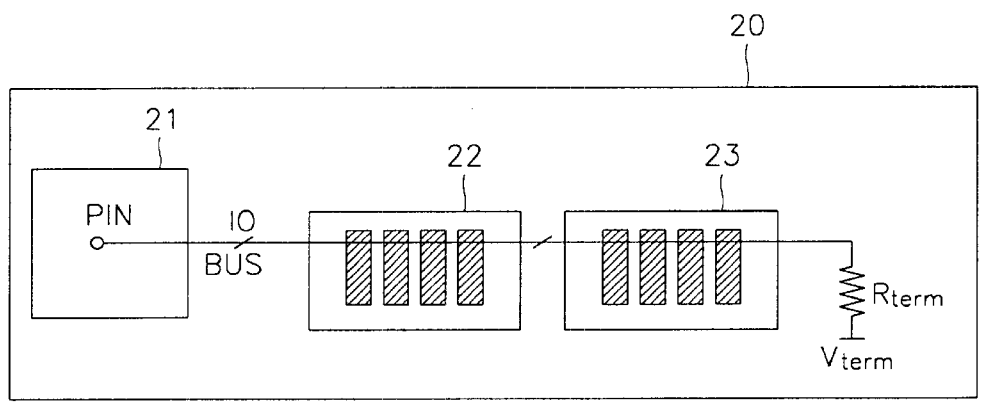
FIG. 2 is a schematic diagram illustrating a conventional computer system board.

In the system board 40 of FIG. 4, the two branches 44, 45 of the bus line IO BUS diverge from the pin PIN of the memory controller 41, and are connected to memory chips in each of the memory modules 42, 43, and thus can provide less propagation delay than the arrangement of FIG. 2. Therefore, the memory controller 41 and the memory modules 42, 43 may operate at relatively higher speed than conventional daisy chain arrangements.

Figure 5:
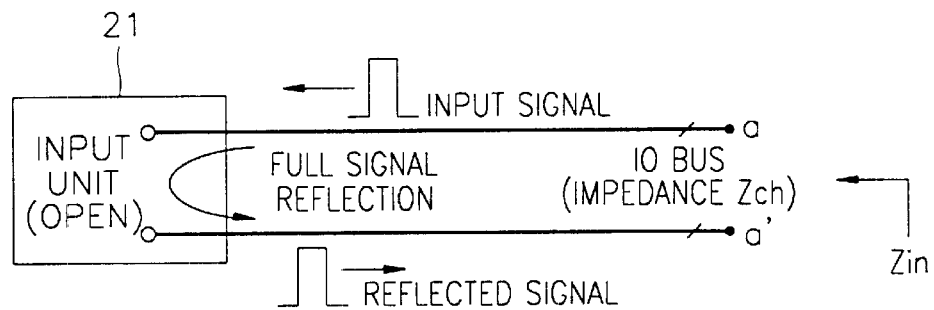
FIG. 5 is a schematic diagram illustrating a signal reflection phenomenon for a conventional memory configuration.

FIG. 5 is a diagram illustrating a phenomenon of signal reflection occurring at the memory controller 21 on the system board 20 of FIG. 2. Referring to FIG. 2, a bus line IO BUS is connected to one pin of the memory controller 21, and the input unit of the memory controller 21 connected to the bus line IO BUS has open-circuit characteristics. Consequently, signals on the bus line IO BUS fed into the memory controller 21 are reflected. For an open circuit input impedance Zin at nodes a, a' of and a characteristic impedance Zch for the bus line IO BUS connecting the nodes a, a' to the memory controller 21, the reflection coefficient R may be found using the following expression:

$$R = \frac{(Zin - Zch)}{(Zin + Zch)}$$
$$= \frac{(\infty - Zch)}{\infty + Zch}$$
$$= 1$$

In other words, the input signal and the reflected signal have the substantially same size and phase.

Figure 6A:
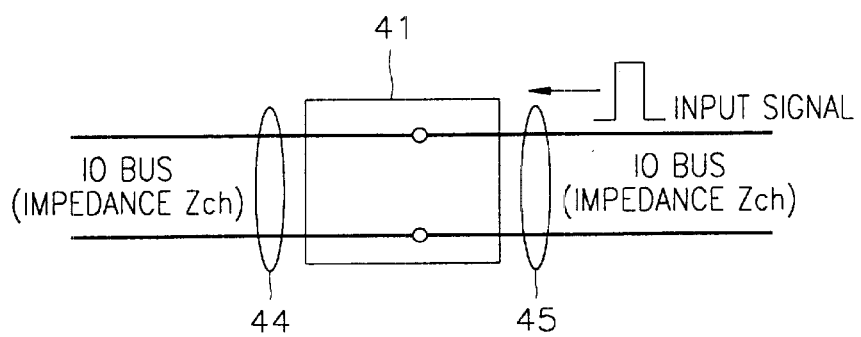
FIG. 6A is a diagram illustrating an exemplary signal reflection for a conventional computer system board.
Figure 6B:
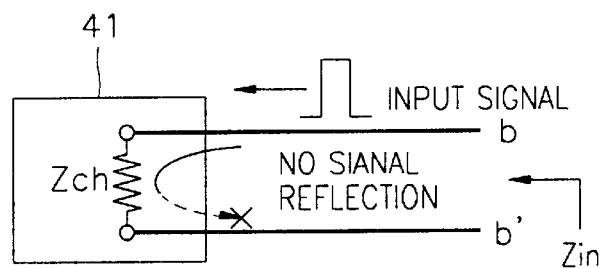
FIG. 6B is a diagram illustrating an exemplary signal reflection for a computer system board according to embodiments of the present invention, respectively.

FIGS. 6A through 6B are diagrams illustrating signal reflection for the system board 40 of FIG. 4. In FIG. 6A, input signals input via a bus line IO BUS toward memory controller 41 can experience a terminating effect due to the connection of the two branches 44, 45 of the bus line IO BUS to common pins of the memory controller 41. As illustrated in FIG. 6B, Zin is the open circuit input impedance of the bus line between ports b, b' can be made substantially the same as the characteristic impedance of the bus line IO BUS Zch. Consequently, the reflection coefficient R can approach zero:

$$R = \frac{(Zin - Zch)}{(Zin + Zch)}$$
$$= \frac{(Zch - Zch)}{Zch + Zch}$$
$$= 0$$

Figure 7:
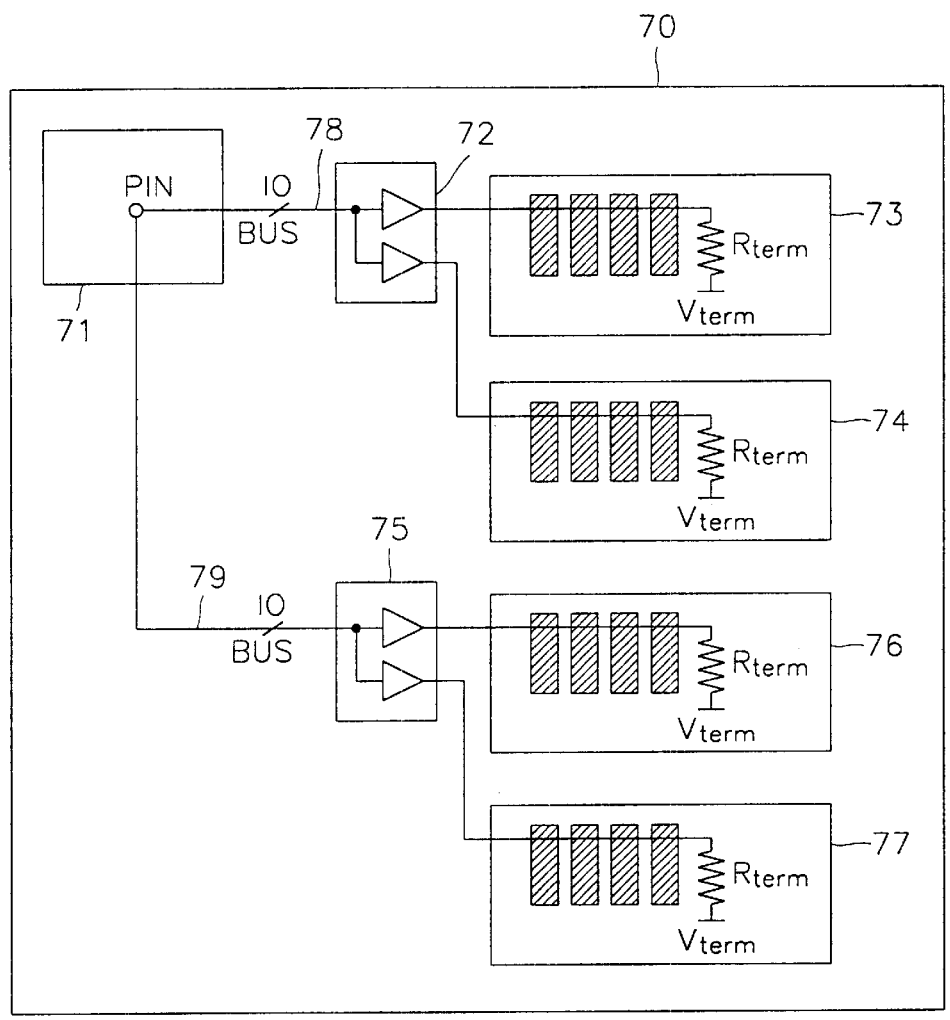
FIG. 7 is a schematic diagram illustrating a computer system board according to other embodiments of the present invention.

Referring to FIG. 7, in some embodiments of the present invention, a computer system board 70 includes a memory controller 71, switches 72, 75, and a plurality of memory modules 73, 74, 76, 77. The switches 72, 75 may include, for example, buffers or FET switches, and they selectively connect bus lines IO BUS to the memory modules 73, 74, 76, and 77.

In the system board 70, two branches 78, 79 of the bus line IO BUS are connected to a common pin PIN of the memory controller 71. A first switch 72 is connected to the first branch 78 and a second switch 75 is connected to the second branch 79. A memory modules 73, 74 of a first group are selectively connected to the first branch 78 by the first switch 72, and memory modules 76, 77 of a second group are selectively connected to the second branch 79 by the second switch 75. This arrangement may be used, for example, where many memory modules have to be mounted on a system board. Consequently, this arrangement may be advantageous in making a system with mass storage capability.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A memory module comprising:
   a substrate;
   bus line conductor on the substrate;
   at least one memory chip on the substrate, connected to the bus line conductor;
   a terminating resistor on the substrate and connected to the bus line conductor; and
   a connector attached to the substrate and configured to connect the bus line conductor to bus line of a computer system board.

2. The memory module of claim 1, wherein the at least one memory chip comprises plurality of memory chips having pins connected in common to the bus line conductor.

3. A computer system board comprising:
   a bus line including a first branch configured to be connected to a first memory module and a second branch configured to be connected to a second memory module; and
   a memory controller directly coupled to both of the first and second branches of the bus line at a single pin thereof.

4. The computer system board of claim 3 in combination with first and second memory modules connected to respective ones of the first and second branches of the bus line via respective first and second connectors.

5. The combined computer system board and first and second memory modules of claim 4, wherein each of the first and second memory modules comprises:
   a plurality of memory chips connected in common to a bus line conductor;
   a terminating resistor connected to the bus line conductor; and
   a connector that couples the bus line conductor of the memory module to a respective one of the first and second branches of the bus line on the system board.

6. A computer system board comprising:
   a bus line including a first branch and a second branch;
   a first switch operative to selectively couple a first plurality of memory modules to the first branch of the bus line;
   a second switch operative to selectively couple a second plurality of memory modules to the second branch of the bus line; and
   a memory controller connected to the first and second branches of the bus line at a single pin thereof.

7. The computer system board of claim 6 in combination with first and second pluralities of memory modules connected to respective ones of the first and second switches.

8. The combined computer system board, first plurality of memory modules and second plurality of memory modules of claim 7, wherein each memory module of the first and second pluralities of memory modules comprises:
   a plurality of memory chips connected in common to a bus line conductor; and
   a terminating resistor connected to the bus line conductor; and
   wherein the first and second switches are operative to selectively connect the bus line conductors of the memory modules to the first and second branches of the bus line.

* * * * *